(12) United States Patent
Cheng et al.

(10) Patent No.: US 10,504,834 B2
(45) Date of Patent: Dec. 10, 2019

(54) CONTACT STRUCTURE AND THE METHOD OF FORMING THE SAME

(71) Applicant: TAIWAN SEMICONDUCTOR MANUFACTURING COMPANY, LTD., Hsinchu (TW)

(72) Inventors: Yu-Wen Cheng, Tainan (TW); Wei-Yip Loh, Hsinchu (TW); Yu-Hsiang Liao, Hsinchu (TW); Sheng-Hsuan Lin, Zhubei (TW); Hong-Mao Lee, Hsinchu (TW); Chun-I Tsai, Hsinchu (TW); Ken-Yu Chang, Hsinchu (TW); Wei-Jung Lin, Hsinchu (TW); Chih-Wei Chang, Hsinchu (TW); Ming-Hsing Tsai, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/909,777

(22) Filed: Mar. 1, 2018

(65) Prior Publication Data
US 2019/0273042 A1 Sep. 5, 2019

(51) Int. Cl.
*H01L 21/285* (2006.01)
*H01L 23/522* (2006.01)
(Continued)

(52) U.S. Cl.
CPC .... *H01L 23/5226* (2013.01); *H01L 21/28518* (2013.01); *H01L 21/4853* (2013.01);
(Continued)

(58) Field of Classification Search
CPC .......... H01L 23/5226; H01L 21/28518; H01L 21/4853; H01L 21/76831; H01L 21/76886; H01L 21/76897; H01L 21/823871
See application file for complete search history.

(56) References Cited

U.S. PATENT DOCUMENTS 5,565,708 A * 10/1996 Ohsaki ................ C23C 14/0641
257/740
5,747,384 A * 5/1998 Miyamoto ........ H01L 21/28512
257/E21.165
(Continued)

*Primary Examiner* — Nathan W Ha
(74) *Attorney, Agent, or Firm* — Birch, Stewart, Kolasch & Birch, LLP

(57) ABSTRACT

A semiconductor device and method of forming the same that includes forming a dielectric layer over a substrate and patterning a contact region in the dielectric layer, the contact region having side portions and a bottom portion that exposes the substrate. The method can also include forming a dielectric barrier layer in the contact region to cover the side portions and the bottom portion, and etching the dielectric barrier layer to expose the substrate. Subsequently, a conductive layer can be formed to cover the side portions and the bottom portion of the contact region and the conductive layer can be annealed to form a silicide region in the substrate beneath the bottom portion of the contact region, and the conductive layer can then be selectively removed on the side portions of the contact region. Finally, a surface treatment can be performed in the contact region to form N-rich areas in the dielectric layer and a nitridation region in the substrate, and an adhesion layer can formed in the contact region to cover the side portions and the bottom portion of the contact region.

20 Claims, 16 Drawing Sheets

(51) Int. Cl.
  *H01L 29/66* (2006.01)
  *H01L 21/768* (2006.01)
  *H01L 21/8238* (2006.01)
  *H01L 23/498* (2006.01)
  *H01L 23/00* (2006.01)
  *H01L 21/48* (2006.01)

(52) U.S. Cl.
  CPC .. *H01L 21/76831* (2013.01); *H01L 21/76886* (2013.01); *H01L 21/76897* (2013.01); *H01L 21/823871* (2013.01); *H01L 23/49811* (2013.01); *H01L 23/49827* (2013.01); *H01L 24/11* (2013.01); *H01L 24/13* (2013.01); *H01L 24/16* (2013.01); *H01L 24/72* (2013.01); *H01L 24/81* (2013.01); *H01L 29/66575* (2013.01)

(56) References Cited

U.S. PATENT DOCUMENTS

| | | | |
|---|---|---|---|
| 8,232,196 B2 * | 7/2012 | Yang | H01L 21/76805 257/774 |
| 8,361,900 B2 * | 1/2013 | Pan | H01L 21/76831 438/660 |
| 8,664,766 B2 * | 3/2014 | Yang | H01L 21/02063 257/774 |
| 9,786,603 B1 * | 10/2017 | Clevenger | H01L 23/5226 |
| 2009/0236746 A1 * | 9/2009 | Kitamura | H01L 21/76843 257/751 |
| 2009/0261478 A1 * | 10/2009 | Joei | H01L 21/28518 257/774 |
| 2015/0048511 A1 * | 2/2015 | Tsai | H01L 21/76865 257/763 |
| 2015/0147880 A1 * | 5/2015 | Lee | H01L 21/76883 438/660 |
| 2015/0235956 A1 * | 8/2015 | Lin | H01L 23/53266 257/757 |
| 2015/0318243 A1 * | 11/2015 | Lin | H01L 21/28518 257/751 |
| 2016/0005824 A1 * | 1/2016 | Lin | H01L 29/41791 438/283 |
| 2017/0018500 A1 * | 1/2017 | Lee | H01L 23/53238 |
| 2017/0243945 A1 * | 8/2017 | Sekine | H01L 29/42324 |
| 2017/0372952 A1 * | 12/2017 | Birner | H01L 21/2885 |
| 2018/0053726 A1 * | 2/2018 | Edelstein | H01L 21/76816 |

* cited by examiner

CONTACT STRUCTURE AND THE METHOD OF FORMING THE SAME

BACKGROUND

Over the past several decades, the semiconductor integrated circuit (IC) industry has experienced rapid growth. The semiconductor integrated circuit (IC) is basically an assembly of semiconductor electronic components, fabricated as a single unit, in which miniaturized active devices (such as transistors and diodes) and passive devices (for example, capacitors and resistors) and their interconnections are built up on a thin substrate of semiconductor material (such as silicon). The integrated circuits are used in almost any electronic device today. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Along with those benefits, such scaling down has also increased the complexity of IC processing and manufacturing. For these advances to be realized, similar developments in IC processing and manufacturing are needed. One area is the interconnects, or contact structures between the transistors and other devices. Although existing methods of fabricating IC devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
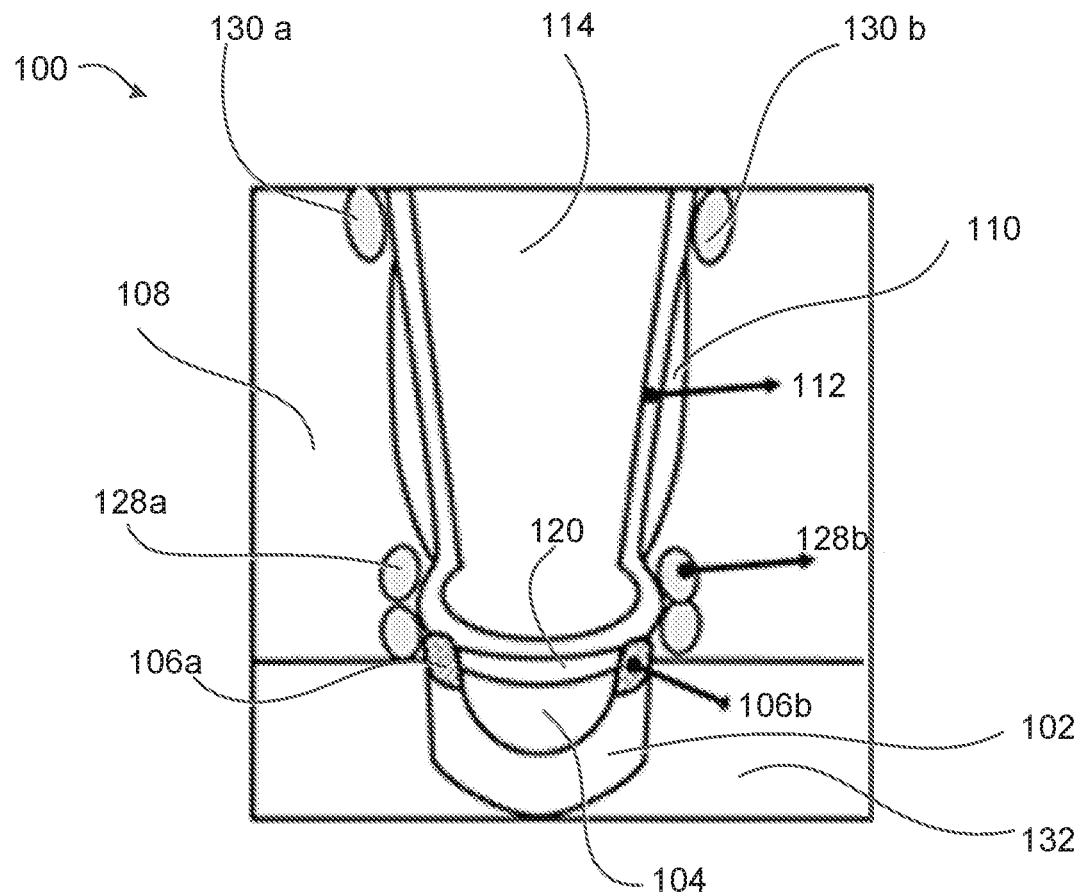
FIG. 1A illustrates a cross-sectional view of an exemplary contact structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a cross-sectional view of an exemplary contact structure 100 in accordance with embodiments of the present disclosure. The contact structure 100 includes a substrate 132 which can be a portion of a fin structure (silicon based) in a Fin Field-Effect Transistor (FinFET) or can be part of a dielectric stack. An epitaxially grown structure 102 can be formed within the substrate 132 and brought level with the top surface of the substrate 132. The epitaxially grown structure 102 can extend into the substrate 132 at varying depth between, for example, 20 nm to 500 nm depending on design. As shown, a depth of the structure 102 at side portions can be smaller relative to a larger depth at a middle portion. In some embodiments, the epitaxially grown structure 102 can be part of a source or drain of a FinFET, or a part of the source or drain of a metal-oxide-semiconductor field-effect transistor (MOSFETs).

The contact structure 100 also includes a dielectric layer 108 formed over the substrate 132 and the epitaxially grown structure 102. As shown, the dielectric layer 108 can be patterned to have an opening or contact region that extends from an upper surface of the dielectric layer 108 downward towards the substrate 132. The opening has top, side, and bottom portions. Critical dimension (CD) of the top portion of the opening in the upper surface of the dielectric layer 108 can be, for example, between 10 nm and 100 nm, while the CD of the bottom portion can be, for example, between 5 nm and 50 nm. The height of the opening can be in a range from 20 nm to 100 nm, for example.

As shown, a silicide region 104 can be formed beneath the bottom portion of the opening and within the epitaxially grown structure 102. The silicide region 104 can extend into the structure 102 with a varying depth from about 20 Å to about 200 Å depending on design. In general, a depth of the silicide region 104 can be smaller at the end portions relative to a larger depth at a middle portion of the silicide region 104. Further, a thin conductive layer 120 may be formed over the silicide region 104 with a thickness in the range from 10 Å to 50 Å, for example.

The contact structure 100 can also include a dielectric barrier layer 110 that is formed on side portions of the opening. The dielectric barrier layer 110 can have various shapes, such as that shown in FIG. 1A, and a thickness of the dielectric barrier layer 110 can vary from 10 Å to 300 Å, for example. The dielectric barrier layer 110 may or may not be in contact with the substrate 132 depending on the technology requirements. Similarly, the dielectric barrier layer 110 may or may not extend to a top surface of the dielectric layer 108 depending on the technology requirements.

The contact structure 100 further includes nitrogen-rich (N-rich) areas 130a, 130b and 128a, 128b that can be formed within surface regions of the dielectric layer 108 along the side portions of the opening. These N-rich areas can be formed by a surface treatment which nitridizes the exposed surface areas of the opening. In some embodiments, the surface treatment can be a free radical or isotropic plasma treatment. In other embodiments, the surface treatment can be an implantation process or a wet chemical treatment.

As shown in FIG. 1A, an N-rich area can be annularly formed around a top portion of the opening. In cross-sectional view, the annularly shaped N-rich area includes 130a and 130b that are adjacent to the top portion of the opening above the dielectric barrier layer 110. Similarly, a second N-rich area can be annularly formed around a bottom portion of the opening. In cross-sectional view, the second annularly shaped N-rich area includes 128a and 128b that are formed below the dielectric barrier layer 110 adjacent to the bottom portion of the opening and can also be in contact with the substrate 132. The N-rich areas 130a and 130b can extend down from the top surface of the dielectric layer 108 toward substrate 132, for example, between 0 nm and 50 nm and extend away from the opening between 0 Å and 50 Å. The N-rich areas 128a and 128b can extend down from the bottom portion of the dielectric barrier layer 110 toward substrate 132, for example, between 0 nm and 30 nm and extend away from the opening between 0 Å and 50 Å.

As shown, the contact structure 100 also includes a nitridation region, shown as 106a and 106b in cross-sectional view, that can be formed annularly in the structure 102 around a periphery of the silicide region 104. In the cross-sectional view, the nitridation regions 106a and 106b can be formed simultaneously with the N-rich areas 130a, 130b and 128a, 128b and by the same surface treatment. The nitridation regions 106a and 106b can extend down into the structure 102 from between, for example, 0 Å to 60 Å and extend away from the edge boundary of silicide region 104 from 0 Å to 60 Å.

An adhesion layer 112 can be arranged over the dielectric barrier layer 110 on side and bottom portions of the opening in the dielectric layer 108. The adhesion layer 112 is formed with a conformal ultrathin thickness of less than 20 Å. Finally, the contact structure 100 can include a metal plug 114 that is formed within the opening of the dielectric layer and in contact with the adhesion layer 112.

Figure 1B:
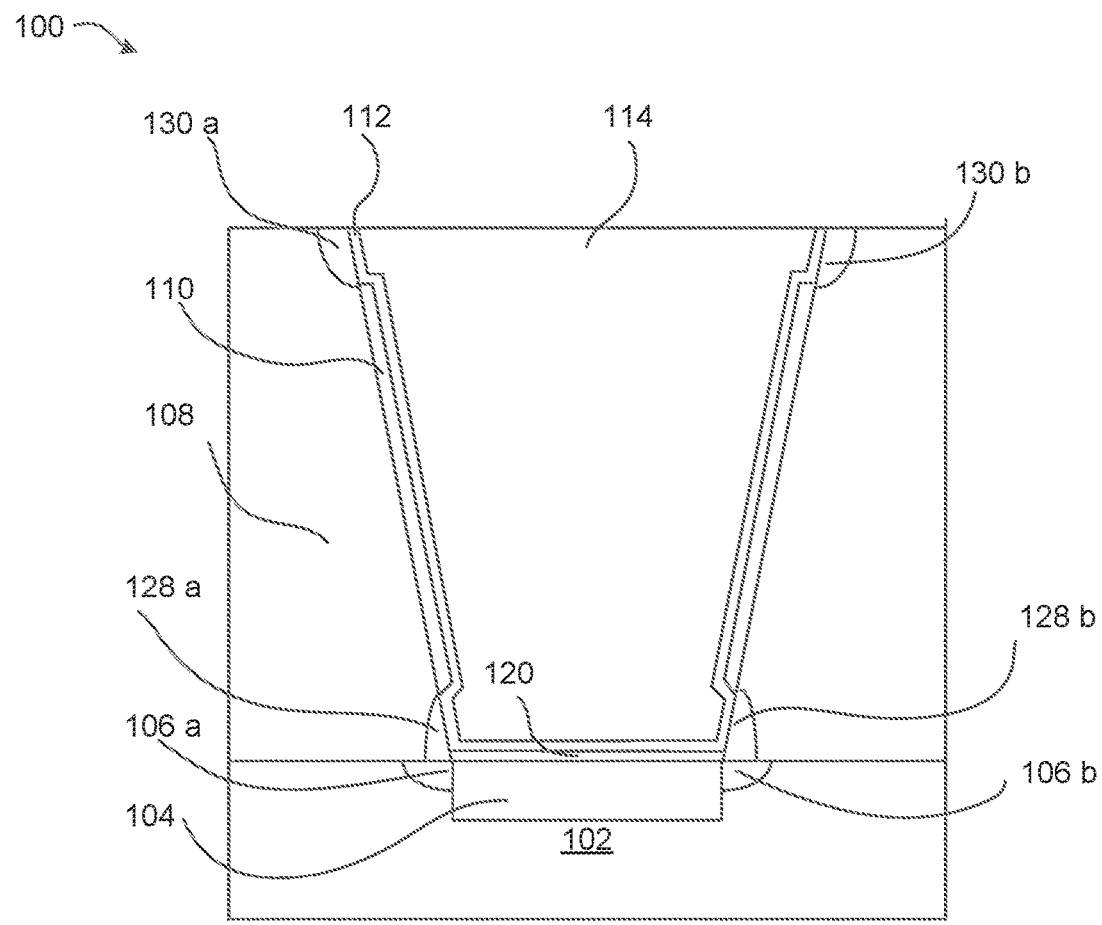
FIG. 1B illustrates a schematic cross-sectional view of an exemplary contact structure, in accordance with some embodiments.

FIG. 1B illustrates a simplified schematic cross-sectional view of the contact structure 100 shown FIG. 1A, with the same reference numerals identifying the same elements. As shown, the contact structure 100 includes a dielectric layer 108 that is formed over a substrate 102. The dielectric layer 108 can be patterned to form an opening or contact region that exposes a portion of the substrate 102 including a silicide region 104 formed therein. A conductive layer 120 can be formed in the bottom portion of the opening over the silicide region 104. The contact structure 100 can also include a dielectric barrier layer 110 and an adhesion layer 112 that are disposed along side and bottom portions of the opening in the dielectric layer 108. A metal plug 114 can be formed within the opening of the dielectric layer 108 in contact with the adhesion layer 112.

The contact structure 100 also has annularly shaped N-rich areas that are formed in the dielectric layer 108. In cross-sectional view, an annularly shaped N-rich area includes 130a and 130b that can be formed adjacent to a top portion of the opening above the dielectric barrier layer 110. Similarly, the second annularly shaped N-rich area includes 128a and 128b that are formed below the dielectric barrier layer 110 adjacent to the bottom portion of the opening and can also be in contact with the substrate 102. The contact structure 100 further includes an annularly shaped nitridation region that can be formed in the substrate 102 around a periphery of the sililcide region 104. In cross-sectional view, the annularly shaped nitridation region includes nitridation regions 106a and 106b that can be formed adjacent to the bottom portion of the opening within the substrate 102. As described above, the nitridation region and N-rich areas can be formed by a surface treatment which nitridizes the exposed surface areas of the opening.

As semiconductor device sizes continue to shrink, it can be increasingly difficult to meet conductivity and reliability requirements of the device's interconnection structures, such as contact vias or contact structures. The contact structure 100 described in the present disclosure can meet both the conductivity and reliability requirements in advanced technology nodes, such as 10 nm and beyond. For example, as contact structures scale down, traditional adhesion layers can fail to leave sufficient spacing for the formation of the metal plug 114. Accordingly, this can result in voids in the metal plug 114.

In the present disclosure, by introducing a surface treatment in the opening prior to coating the adhesion layer, a uniform and ultrathin (less than 20 Å) adhesion layer 112 can be formed along both side and bottom portions of the opening in the dielectric stack. The ultrathin adhesion layer 112 can effectively serve as a barrier layer to prevent the reflow/diffusion of the metal plug 114 into the surrounding layers, as well as an effective adhesion layer to help the adhesion of the metal plug 114 within the opening of the dielectric stack. In addition, the dielectric barrier layer 110 on the side portions of the opening can act as a diffusion barrier to prevent the electrical short from the adjacent contacts or components, and hence can improve both the electrical and reliability properties.

As illustrated in FIGS. 1A and 1B, surface treatment can be used to introduce N-rich areas 130a, 130b and 128a, 128b to the side portions of the opening, and nitridation regions 106a and 106b to the bottom portion of the opening, respectively. Both the N-rich areas and the nitridation regions can act as a diffusion barrier, as well as to prevent the reflow/diffusion of the metal plug 114 into the surrounding layers. The N-rich areas and the nitridation regions can also prevent electrical shorts from the adjacent contacts or components, and hence can improve both electrical and reliability properties.

In embodiments, the metal plug 114 may be cobalt (Co), tungsten (W), ruthenium (Ru), aluminum (Al), copper (Cu), or the like. In FIG. 1B, the metal plug 114 electrically contacts a silicide region 104 of an underlying structure through the adhesion layer 112 and the conductive layer 120, such as silicided source/drain region or a silicided gate electrode. In the embodiment of FIG. 1B, the silicide region 104 is a self-aligned silicide (silicide) that can be formed by annealing a conductive film. In some embodiments, the silicide region 104 includes $TiSi_x$, $NiSi_x$, $WSi_x$, $CoSi_x$, $PtSi_x$, or the like. Silicide region 104 formed herein will provide a good ohmic contact between the substrate 102 and the contact structure 100, and therefore can improve the conductivity of semiconductor device. The underlying silicided structure (e.g., the substrate 102) could include silicon (Si), silicon germanium (SiGe), silicon phosphorous (SiP), silicon carbide (SiC), or the like, or the combination thereof, for example. In other embodiments, the underlying substrate 102 could also be a metal or other conductors.

As further illustrated by FIGS. 1A and 1B, the contact structure 100 includes a dielectric layer 108 over the substrate 102. In embodiments, the dielectric layer 108 can be an inter-layer dielectric (ILD), an inter-metallization dielectric (IMD) layer, a low-K material layer, or the like, or a combination thereof. The dielectric layer 108 can also include SiN, SiCN, SiC, $AlO_x$, the like, or the combination. It should be understood that the dielectric layer 108 can include any number of layers and, as described above, the dielectric layer 108 can be patterned and opened to expose the substrate 102.

In embodiments, the dielectric barrier layer 110 may be SiN, SiCN, SiC, SiON, $AlO_x$, or the like, or the combination thereof, with a thickness, for example, in the range between 20 Å and 200 Å. In embodiments, the adhesion layer 112 may be TiN, TaN, or the like, having a thickness less than 20 Å.

In FIGS. 2 through 13, an exemplary technique of manufacturing the contact structure 100 will be described with reference to exemplary schematic cross-sectional views of a contact structure at intermediary steps of manufacturing. Beginning with FIG. 2, a dielectric layer 108 can be formed on a substrate 102. The substrate 102 may be a portion of the source or drain of FinFET, or a portion of the source or drain of metal-oxide-semiconductor field-effect transistors (MOSFETs), which includes silicon (Si), germanium (Ge), silicon carbide (SiC), silicon germanium (SiGe), silicon phosphorous (SiP), or the like, or the combination thereof. In some embodiments, the substrate 102 may be a semiconductor substrate that can include silicon (Si), germanium (Ge), silicon carbide (SiC), silicon germanium (SiGe), or diamond. In other embodiments, the substrate 102 may be metal, such as tungsten (W), copper (Cu), or the like. In various embodiments, the substrate 102 could be composite including TiN, TaN, AlTiC, AlTiO, AiTiN, W, or the like, or the combination thereof. Alternately, the substrate 102 may include a compound semiconductor and/or an alloy semiconductor. By way of example, in some embodiments, the substrate 102 may also include silicon phosphide (SiP), silicon phosphorus carbide (SiPC), a silicon-on-insulator (SOI) structure, a SiGe-on-SOI structure, a Ge-on-SOI structure, a III-VI materials, or a combination of any of the above materials. Further, the substrate 102 may optionally include an epitaxial layer (epi-layer), may be strained for performance enhancement, and/or have other suitable enhancement feature.

In various embodiments, the dielectric layer 108 may be a first inter-layer dielectric (ILD) or an inter-metallization dielectric (IMD) layer. The dielectric layer 108 may be formed, for example, of a low-k dielectric material having a k value less than about 4.0 or even about 2.8. The dielectric layer 108 may be phosphosilicate glass (PSG), borophosphosilicate glass (BPSG), FSG (SiOF series material), SiOxCy, Spin-On-Glass, Spin-On-Polymers, silicon carbon material, compounds thereof, and the like. In embodiments, the dielectric layer 108 can also include SiN, SiCN, SiC, $AlO_x$, the like, or the combination. The dielectric layer 108 can be deposited through by any suitable method, such as atomic layer deposition (ALD), physical vapor deposition (PVD), liquid source misted chemical deposition (LSMCD), spinning, chemical vapor deposition (CVD), coating or any another process that is adapted to form a thin film layer over the substrate. Dielectric layer 108 may also include multiple layers, such as isolation layers, glue layers, buffer layers, and the like. The thickness of the dielectric layer 108 varies with the applied technology and can range, for example, from 1000 Å to about 30000 Å.

Figure 2:
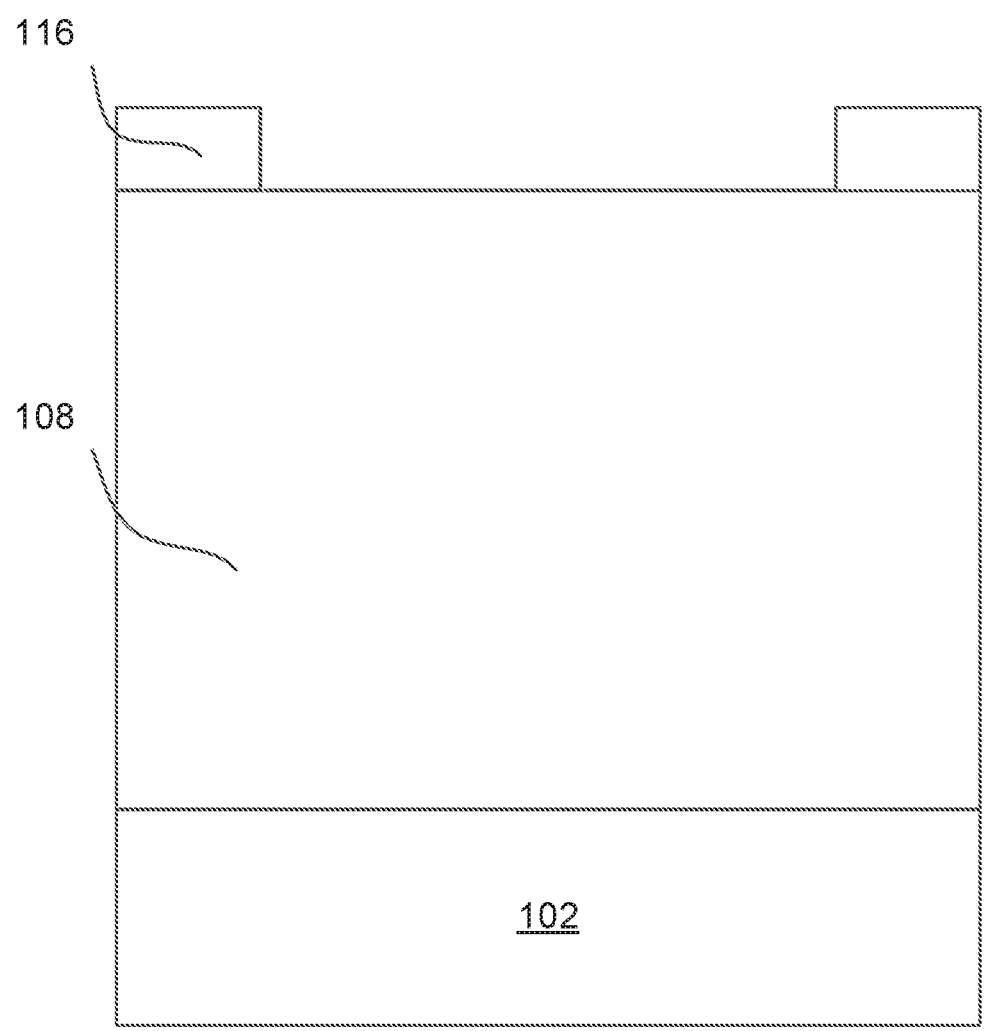
FIGS. 2 through 13 illustrate exemplary schematic cross-sectional views of various intermediary steps of manufacturing a contact structure, in accordance with some embodiments.

As shown in FIG. 2, a patterned photoresist 116 can also be form over the dielectric layer 108. Of course the photoresist 116 can be pattern according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. In some embodiments, the photoresist 116 can be a layer of photosensitive polymer used to transfer pattern from mask (not shown herein) to underlying substrate. In some embodiments, the photoresist 116 could include multiple layers, such as underlayer, hardmask, bottom anti-reflective coatings (BARC), and other suitable materials according to the technology requirement.

Figure 3:
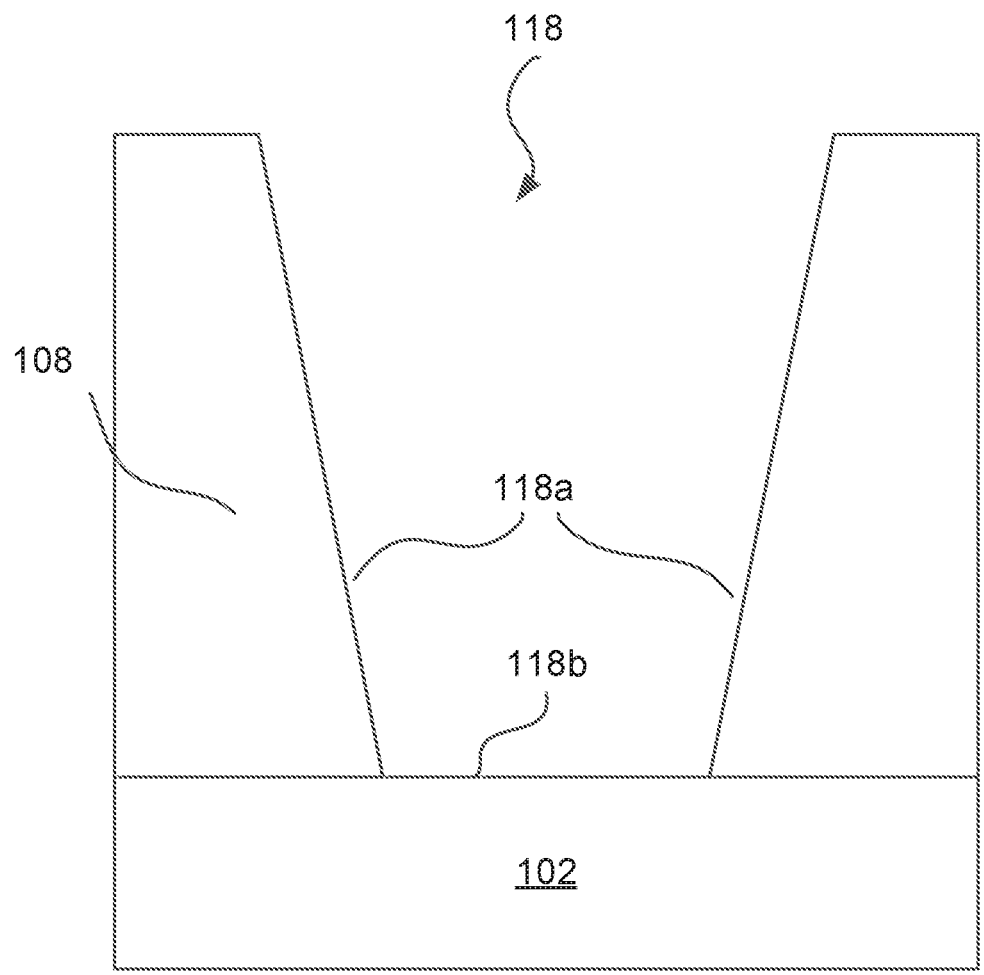

In FIG. 3, an opening or contact region 118 is formed in the dielectric layer 108, through an etching process. The opening 118 has side portions 118a and a bottom portion 118b that exposes the substrate 102. Any suitable technique can be used to etch the opening 118, for example, in some embodiments the etching process may include dry etching (e.g., RIE or ICP etching), wet etching, and/or other etching methods. The etching process is used to etch portions of the dielectric layer 108, and expose the substrate 102 via the opening 118. The opening 118 may expose a region of the underlying substrate 102, such as a source/drain region, a gate electrode, a metal substrate, a Si substrate, or the other components of a semiconductor device. Subsequently, the remaining photoresist 116 can be removed by, for example, a plasma ashing and/or wet clean processes. Although only one opening 118 is shown, of course any number of openings may be patterned over the substrate 102, through dielectric layer 108, depending on device design.

In some embodiments, other layers may be used in the patterning process. For example, one or more hard masks (not shown) might be formed above the dielectric layer 108 prior to formation of photoresist 116, in which embodiments the pattern from photoresist 116 would first be imposed upon the one or more hard masks and the patterned hard masks would be used in patterning dielectric layer 108 afterward. Generally, one or more hard mask layers may be useful in embodiments in which the etching process requires masking in addition to the masking provided by the photoresist material. During a subsequent etching process to pattern dielectric layer 108, the patterned photoresist mask will also be etched, although the etch rate of the photoresist material may not be as high as the etch rate of dielectric layer 108. If the etch process is such that the patterned photoresist mask may be consumed prior to completing the etching process on dielectric layer 108, then an additional hard mask may be utilized. The material of the hard mask layer or layers is selected such that the hard mask layer(s) exhibit good deposition uniformity and lower etch rate than the underlying materials, such as the materials of the dielectric layer 108. In some embodiments, the hard mask layers are silicon oxynitride (SiON), TiN, spin on hardmask (SOH), silicon nitride (SiN), silicon carbide (SiC), silicon oxide ($SiO_2$), or a combination thereof.

Figure 4:
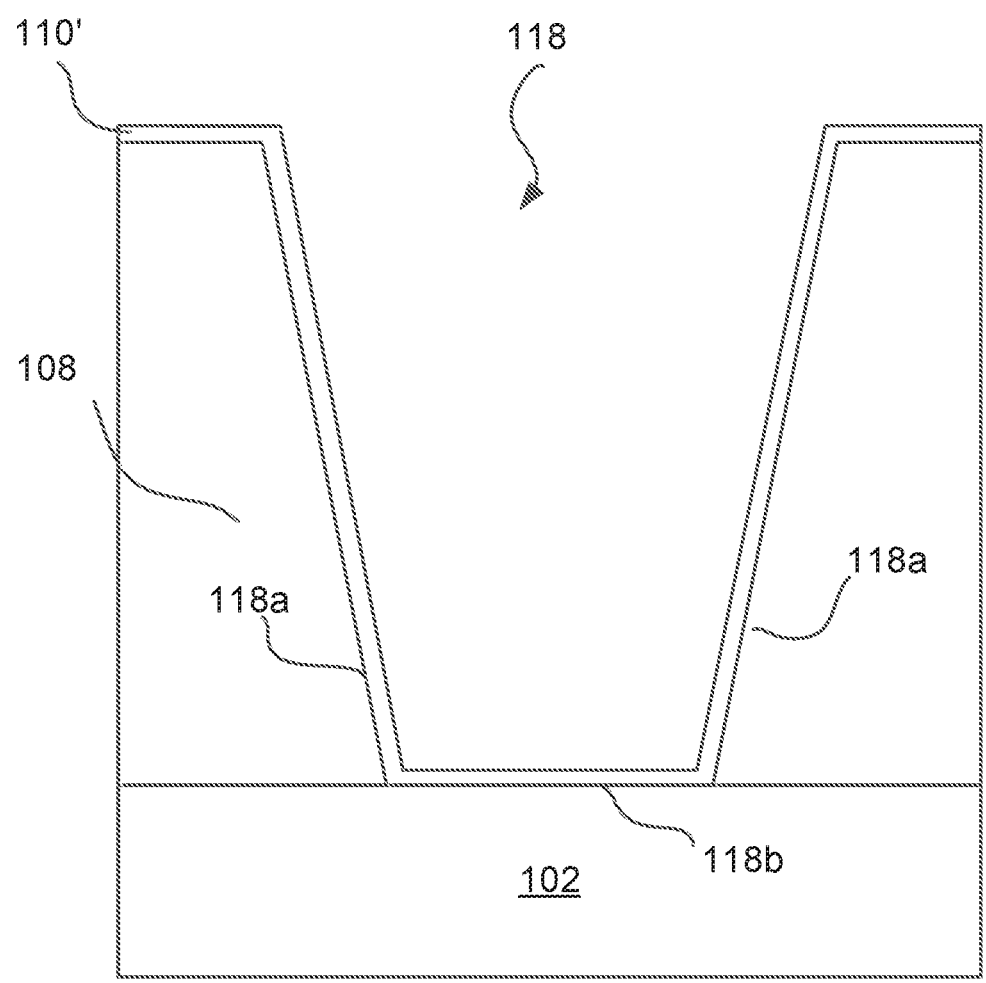

In FIG. 4, a dielectric barrier layer 110' is deposited in the opening 118 to cover the side portions 118a and bottom portion 118b. In some embodiments, the dielectric barrier layer 110' may be SiN, SiCN, SiC, SiON, $AlO_x$, or the like, or the combination thereof. In various embodiments, each of the dielectric barrier layers 110' may be deposited by a suitable deposition process, such as chemical vapor deposition (CVD), physical vapor deposition (PVD), atomic layer deposition (ALD), e-beam evaporation, or any combination thereof. As semiconductor devices keep shrinking, the spacing between two contacts or between the contact and the adjacent components can be reduced correspondingly. The reduced spacing could result in electrical shorts as well as reliability failures. The dielectric barrier layer 110' disclosed herein servers as a diffusion barrier layer to prevent electrical shorts and the reliability failures, such as the TDDB (Time-dependent dielectric breakdown).

Figure 5:
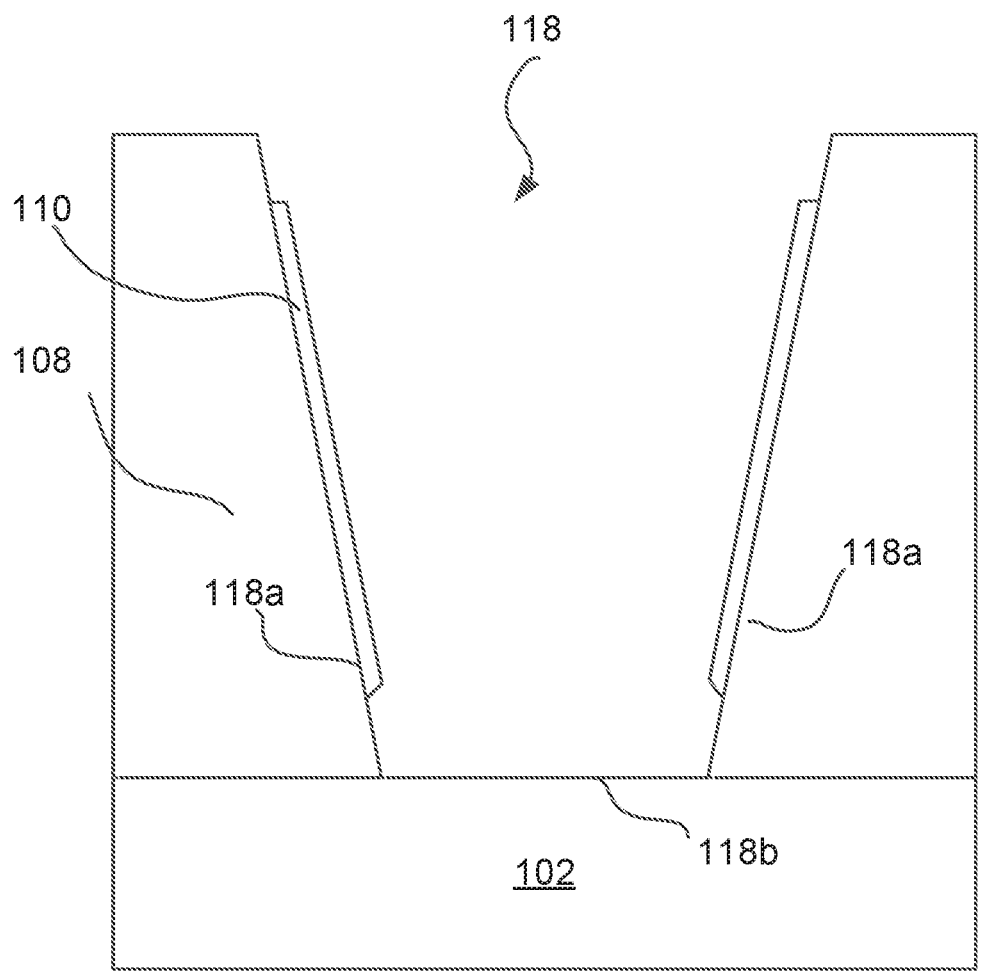

In FIG. 5, the dielectric barrier layer 110' can be etched to expose the substrate 102. In some embodiments, the etching process may include blanket dry etching (e.g., blanket RIE or ICP etching). Blanket etching herein can mean an etching process without any mask to protect a portion of the contact structure 100. During the blanket dry etching, a directional plasma or anisotropic plasma can be generated to remove a bottom portion of the dielectric barrier layer 110'. As shown, during the removal the bottom portion of the dielectric barrier layer 110' that includes the bottom portion 118b and some of the adjacent lower side portion 118a of the opening 118 can be removed. Further, a top portion of the dielectric barrier layer 110' along with some of the upper side portion 118a of the opening 118 can be removed as well.

As a result of the blanket etching process, the dielectric barrier layer 110' becomes dielectric barrier layer 110 that only partially covers the side portion 118a of the contact opening 118. As shown, the dielectric barrier layer 110 can remain on the side portions 118a of the contact opening 118 only, and the dielectric barrier layer 110 is not in contact with the substrate 102, illustrated in FIG. 5. As a result of the blanket etching, the dielectric barrier layer 110 can have various shapes, such as that shown in FIG. 1A, and a thickness of the dielectric barrier layer 110 can vary along its length from 10 Å to 300 Å, for example. In some embodiments, the dielectric barrier layer 110 remains on the side portions 118a of the contact opening 118, and the dielectric barrier layer 110 is also in contact with the substrate 102, depending on the etching process. For example, as desired a mask could be applied to expose the bottom portion of the dielectric barrier layer 110' only.

Figure 6:
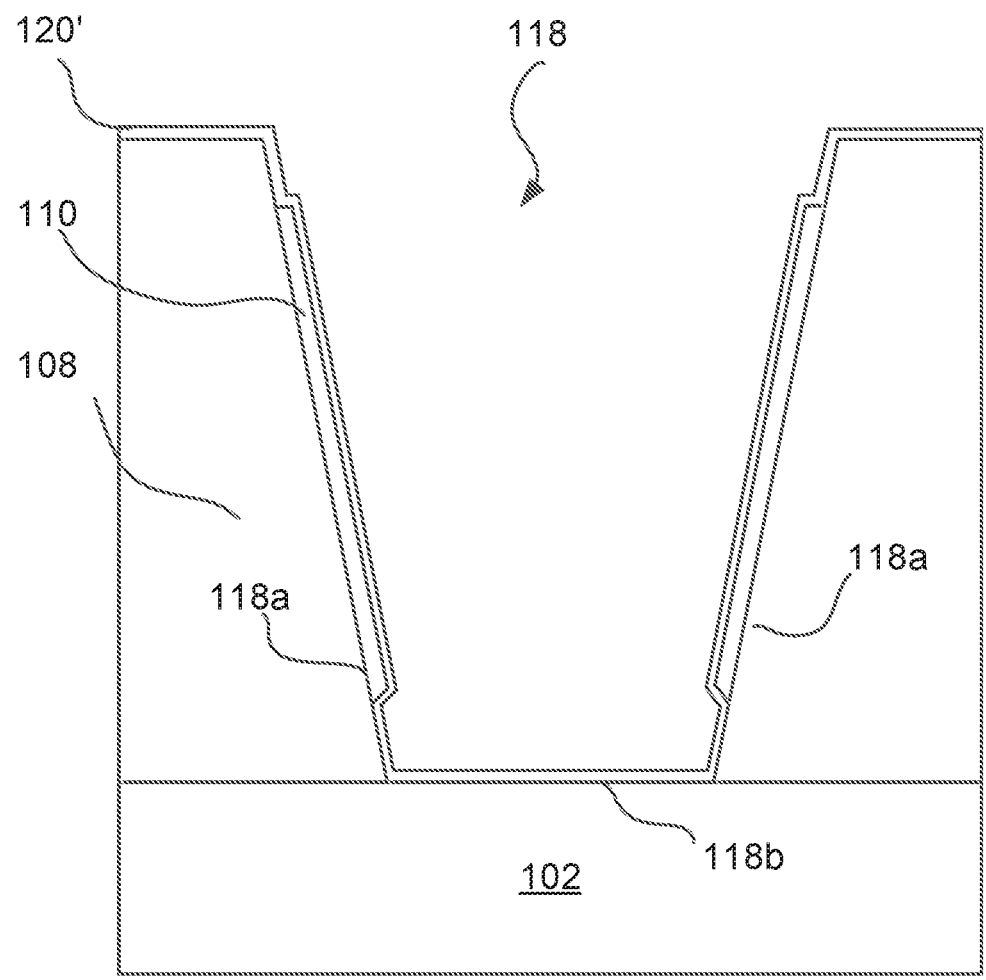

In FIG. 6, a conductive layer 120' is formed in the opening 118 over the side portions 118a and bottom portion 118b of the opening 118, as well as over the exposed substrate 102. As shown, the conductive layer 120' can also be formed over the dielectric barrier layer 110. The conductive layer 120' can have a thickness, for example, ranging from about 10 Å to about 200 Å and can be deposited by physical vapor deposition (PVD), chemical vapor deposition (CVD), plasma-enhanced CVD (PECVD), low pressure CVD (LP-CVD), atomic layer deposition (ALD), sputtering, or other well-known deposition techniques. The conductive film 120' may be titanium (Ti), nickel (Ni), tungsten (W), cobalt (Co), platinum (Pt) or the like. In other embodiments, the conductive layer 120' may be a bi-layer structure, such as Ti/TiN or Co/TiN, where the Ti or Co can be deposited at first and TiN can be coated over the Ti or Co afterwards.

Figure 7:
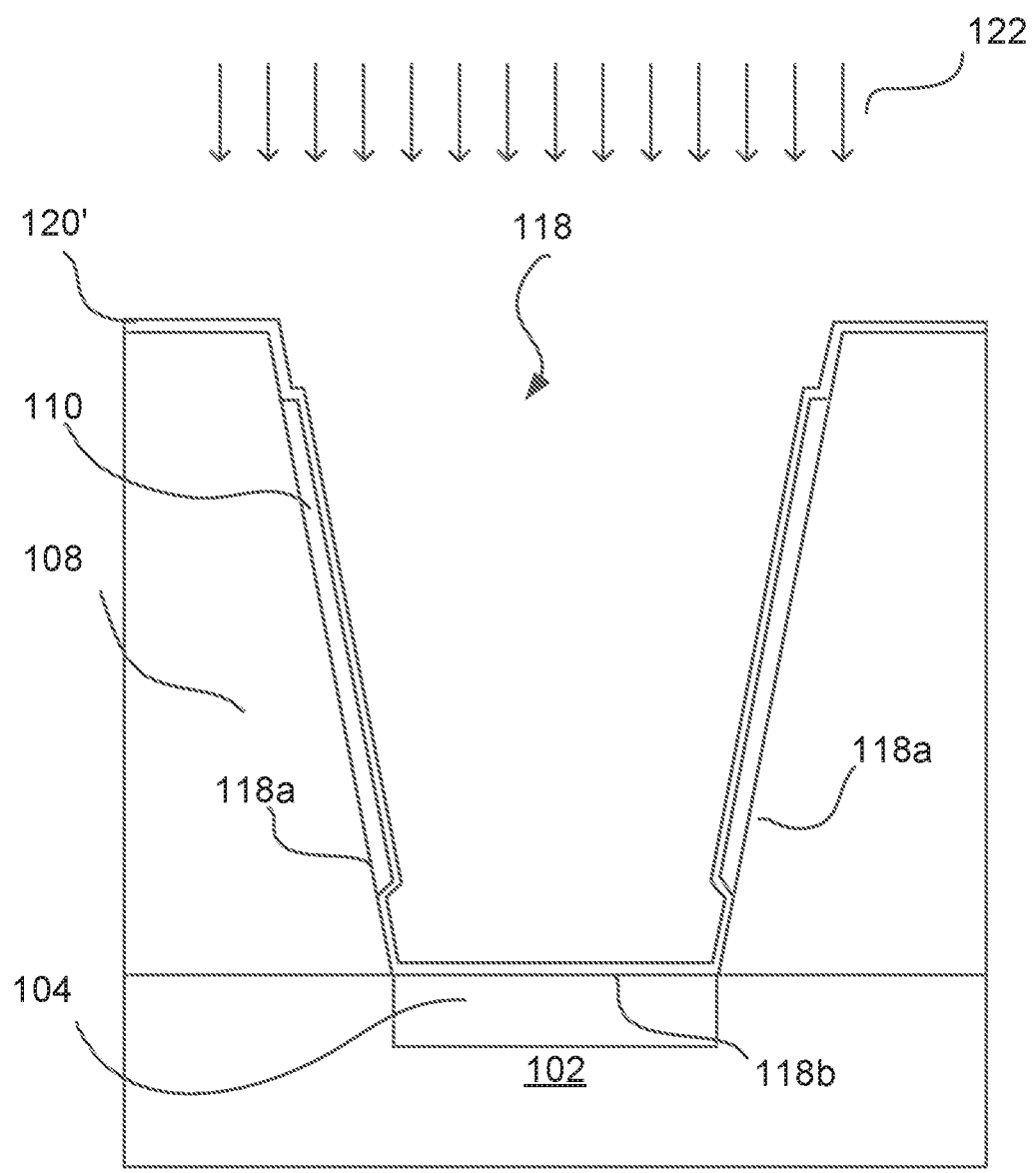

In FIG. 7, an annealing process 122 can be used to form a silicide region 104 in the substrate 102 beneath the bottom portion 118b of the contact opening 118. As the semiconductor device sizes continue to shrink, the critical dimension (CD) of the contact structure can also reduce. The smaller CD will increase the resistance of the contact structure and new structure design can be needed to reduce the resistivity. The silicide region 104 formed herein can provide a good ohmic contact between the substrate 102 and the contact structure 100, and therefore improve the conductivity of semiconductor device. The silicide region 104 may be formed by diffusing the conductive layer 120' into an upper portion of substrate 102. In some embodiments, an annealing process 122 may be performed at a temperature of about 100° C. to about 900° C. using argon (Ar) or nitrogen ($N_2$) as a process gas under an atmosphere pressure of about 770 Torr to about 850 Torr. After annealing, bottom portions of conductive layer 120' may be diffused into substrate 102, while portions of conductive layer 120' on side portion 118a of opening 118 may remain. In some embodiments, the silicide region 104 includes $TiSi_x$, $NiSi_x$, $WSi_x$, $CoSi_x$, $PtSi_x$, or the like, depending on the material type of conductive layer 120'. Illustrated in FIG. 1A, the silicide region 104 can extend into the structure 102 with a varying depth from about 20 Å to about 200 Å depending on the design. In general, a depth of the silicide region 104 can be smaller at the end portions relative to a larger depth at a middle portion of the silicide region 104.

Figure 8:
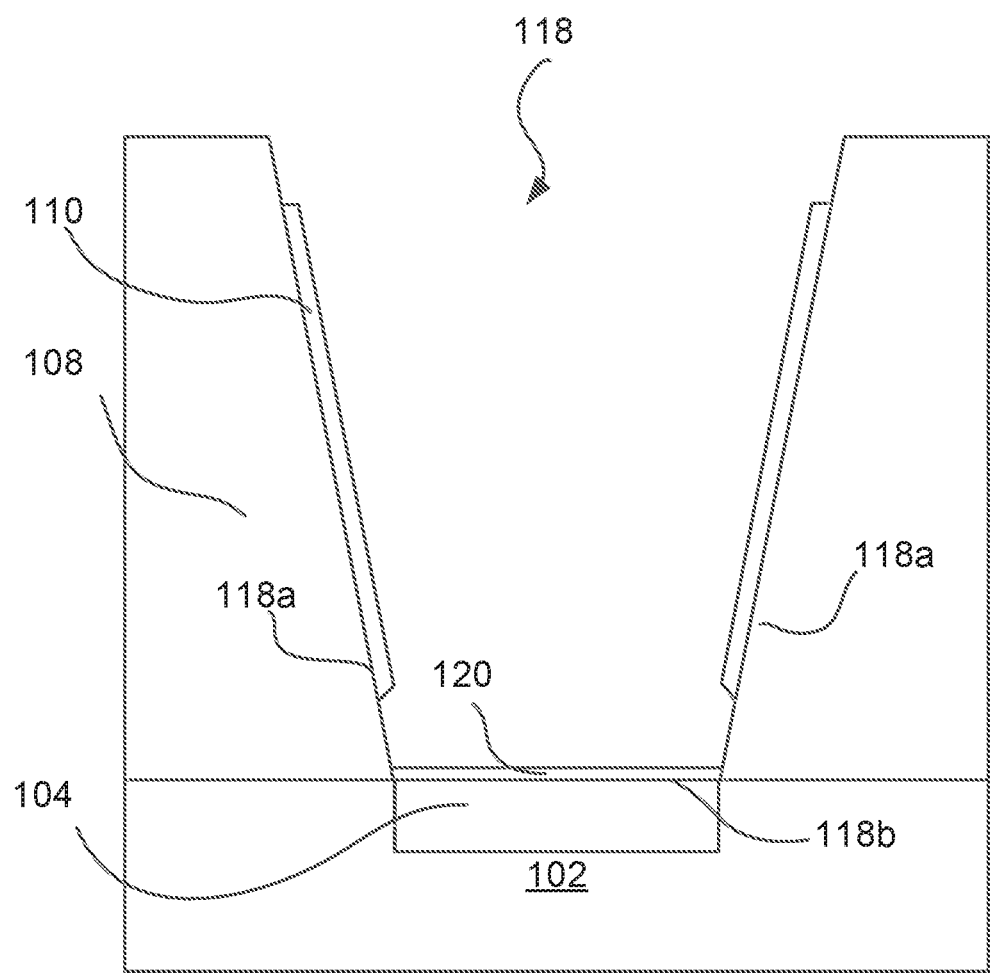

Shown in FIG. 8, after annealing, the conductive layer 120' can be selectively removed so that the part of conductive layer 120' along the side portions 118a of the opening 118 is removed, while the part of the conductive layer 120' over the bottom portion 118b of the opening remains. As a result of the selective removal, the remaining conductive layer 120 covers the bottom portion 118b of the opening 118 over the silicide region 104. After the annealing process and the selective removal, the remaining conductive layer 120 over the silicide region 104 can have a thickness between 10 Å and 50 Å, for example.

The selective removal of the conductive layer 120' is implemented through a selective etching process, where a mask can be applied to protect the part of the conductive layer 120' over the bottom portion 118b of the opening 118. In some embodiments, the etching process may include wet etching. For example, if the conductive layer 120' is titanium (Ti), a solution of $HF:H_2O_2:DI$ water may be used as a selective wet etch. In some embodiments, the etching process may include dry etching (e.g., RIE or ICP etching). If the conductive layer 120' is tungsten (W), a selective dry etch having a selective reactive ion etch using $Cl_2:NF_3$ etch chemistries may be applied.

Still referring to FIG. 8, in other embodiments, the conductive layer 120 can be directly formed through a selective growth where a conductive layer will preferably nucleate and grow on the substrate 102, while the conductive layer does not form on the side portions 118a of the opening 118. The corresponding process flow of a selective growth of the conductive layer 120 will include forming the conductive layer 120 preferably over the substrate 102, annealing the contact structure 100 to form the silicide region 104, and skipping the selective etching process.

According to some techniques, the conductive layer 120' can remain in the contact structure 100 and act as a conductive layer to provide a good ohmic contact. It also serves as a transition layer to help nucleation of the adhesion layer, such as the adhesion layer 112. However, as the critical dimension (CD) of the contact structure 100 is reduced in advanced technology node, the conductive layer 120' is selectively removed to leave spacing for the formatting the void-free metal plug 114. In the present disclosure, a novel surface treatment will be introduced to promote the formation of adhesion layer 112.

Figure 9:
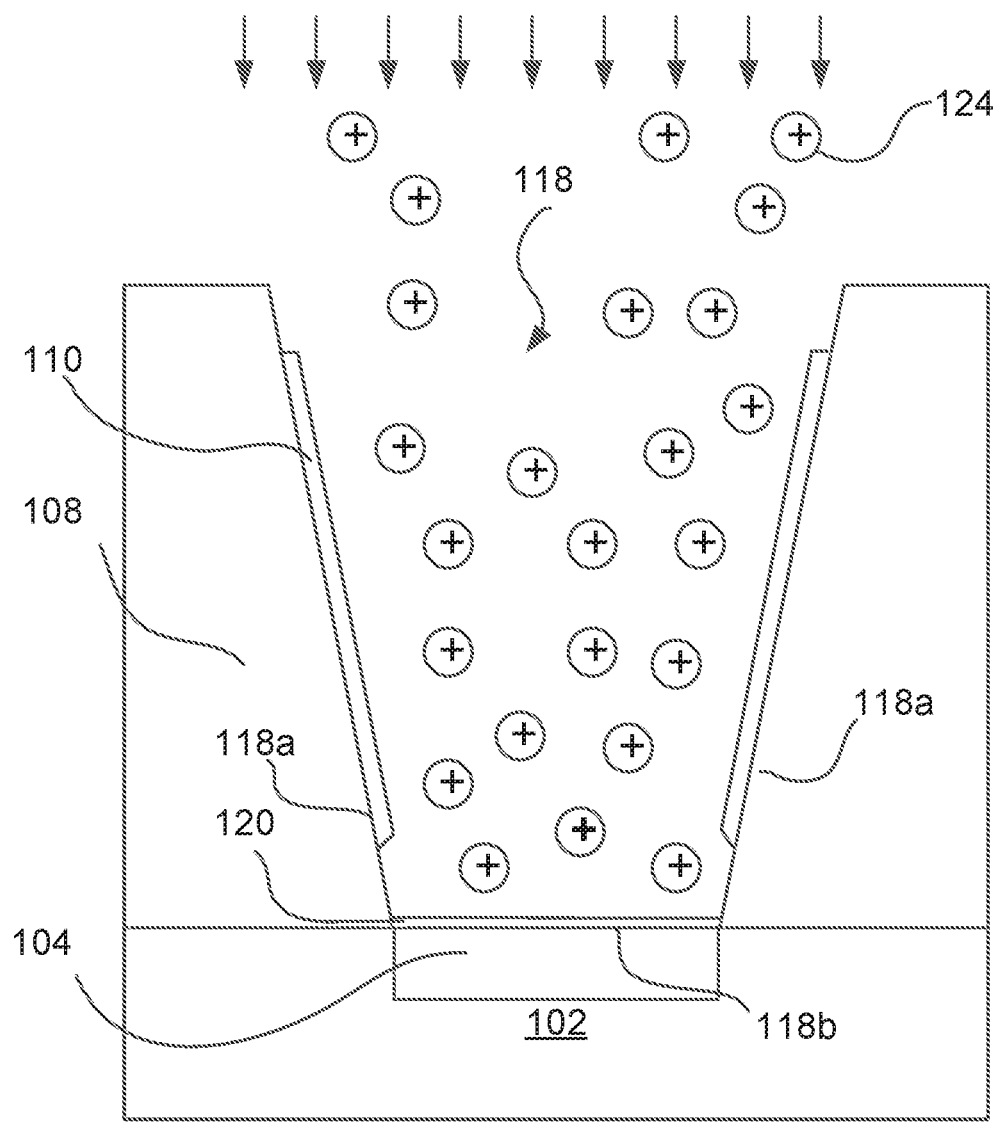

In FIG. 9, a surface treatment 124 is applied to treat the opening 118. As mentioned in the previous step, the conductive layer 120' can be selectively removed to leave spacing for the formation of the metal plug 114. A conductive layer 120' can conventionally remain in the side portions of the contact structure to act as an ohmic contact, as well as a transition layer to help the nucleation of the adhesion layer, such as the adhesion layer 112 illustrated in FIGS. 1A and 1B. However, in the present disclosure, a surface treatment 124 can be applied to the opening 118 in order to enhance the nucleation of the subsequently deposited adhesion layer 112. Application of the surface treatment 124 can be by a free radical plasma treatment, where the reaction gases are $H_2$, $N_2$, $NH_3$, $SiH_4$, or any other suitable gases, or the combination thereof. The free radical plasma treatment can be an isotropic plasma treatment where both the side portions 118a and the bottom portions 118b of the contact opening 118 are treated. In some embodiments, the free radical plasma treatment is performed in an atomic layer deposition (ALD) tool. In other embodiments, the free radical plasma treatment may be performed in a dry etch tool, a dry strip tool, or other tools suitable for plasma generation and treatment. Application of the surface treatment 124 can also be an implantation process where a nitrogen ion beam can be generated and then implanted into the desired surface areas in the opening 118. The surface treatment 124 can be a wet chemical treatment and, where suitable, wet chemistry can be applied to nitridize the exposed surface areas of opening 118 shown in FIG. 9.

Figure 10:
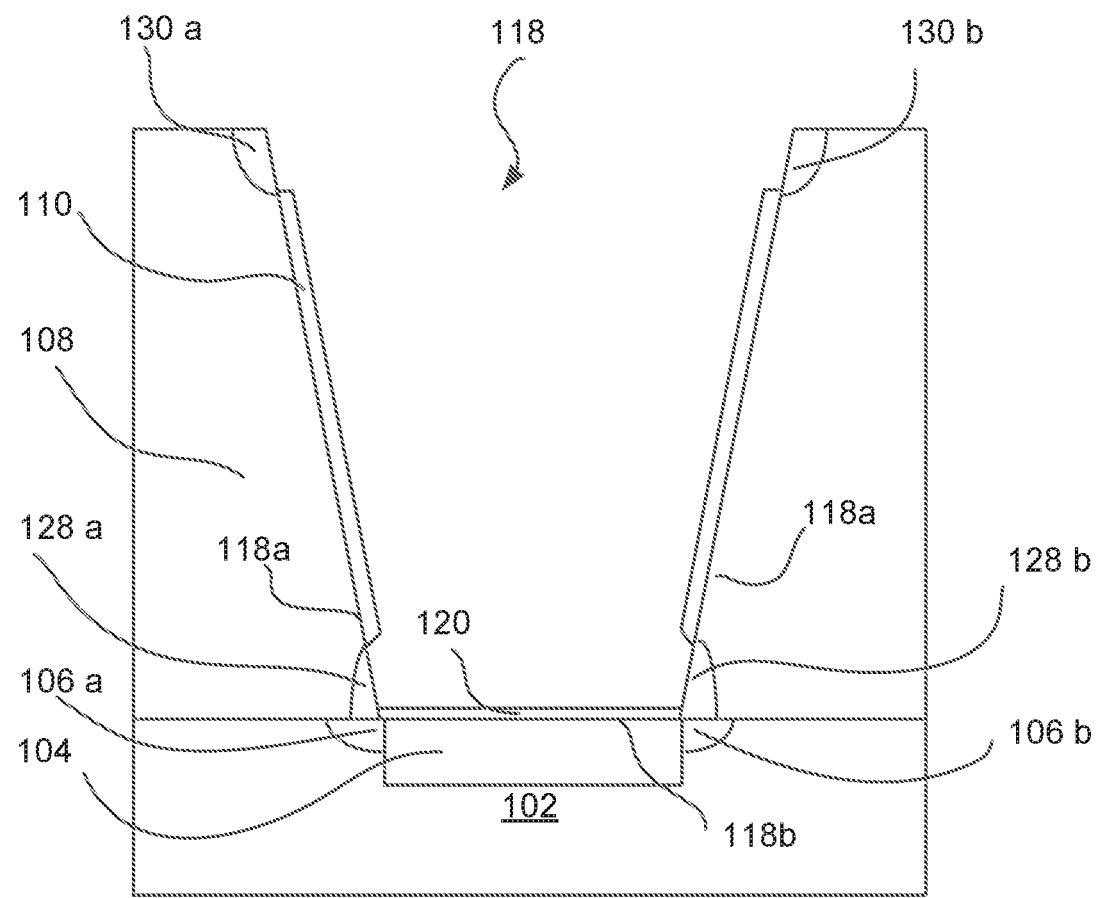

In FIG. 10, as a result of the surface treatment in FIG. 9, annularly shaped N-rich areas can be formed in the dielectric layer 108. In cross-sectional view, an annularly shaped N-rich area includes 130a and 130b that are formed adjacent to a top portion of the opening above the dielectric barrier layer 110. Similarly, a second N-rich area can be annularly formed around a bottom portion of the opening. In cross-sectional view, the second annularly shaped N-rich area includes 128a and 128b that are formed below the dielectric barrier layer 110 adjacent to the bottom portion 118b of the opening 118 and can also be in contact with the substrate 102. The N-rich areas 130a and 130b can extend down from the top surface of the dielectric layer 108 toward substrate 102, for example, between 0 nm and 50 nm and extend away from the opening between 0 Å and 50 Å. The N-rich areas 128a and 128b can extend down from the bottom end of the dielectric barrier layer 110 toward the substrate 102, for example, between 0 nm and 30 nm and extend away from the opening between 0 Å and 50 Å. In the N-rich areas (130a, 130b and 128a, 128b), the nitrogen atomic density can be in a range, for example, from $1\times10^{21}$ cm$^{-3}$ to $3\times10^{21}$ cm$^{-3}$. Alternatively, the nitrogen atomic percentage in the N-rich areas (130a, 130b and 128a, 128b) can be in a range, for example, from 0% to 50%.

The contact structure 100 also includes an annularly shaped nitridation region that can be formed in the substrate 102 around a periphery of the sililcide region 104. In cross-sectional view, the annularly shaped nitridation region includes nitridation regions 106a and 106b that can be formed adjacent to the bottom portion of the opening within the substrate 102. The nitridation regions 106a and 106b can extend down into the structure 102 from 0 Å to 60 Å and extend away from the edge boundary of silicide region 104 from 0 Å to 60 Å. In nitridation regions 106a and 106b, the nitrogen atomic density can be in a range from $1\times10^{21}$ cm$^{-3}$ to $3\times10^{21}$ cm$^{-3}$, and the nitrogen atomic percentage can be in a range from 0% to 60%.

The surface treatment can nitridize the exposed surface areas in the opening 118 and improve the nucleation/incubation of the subsequent adhesion layer 112 to the complex surface condition in the opening 118. As shown in FIG. 8, the adhesion layer 112 adheres to the conductive layer 120, dielectric layer 108, and dielectric barrier layer 110. In addition, both the N-rich areas and the nitridation regions can act as diffusion barriers to prevent electrical shorts from the adjacent contacts or components, and hence can improve both electrical and reliability properties. For example, both the N-rich areas and the nitridation regions can function as barrier layers to the metal plug 114 and prevent the metal plug 114 from diffusing into the surrounding layers, which can cause electrical short or reliability failure.

Figure 11:
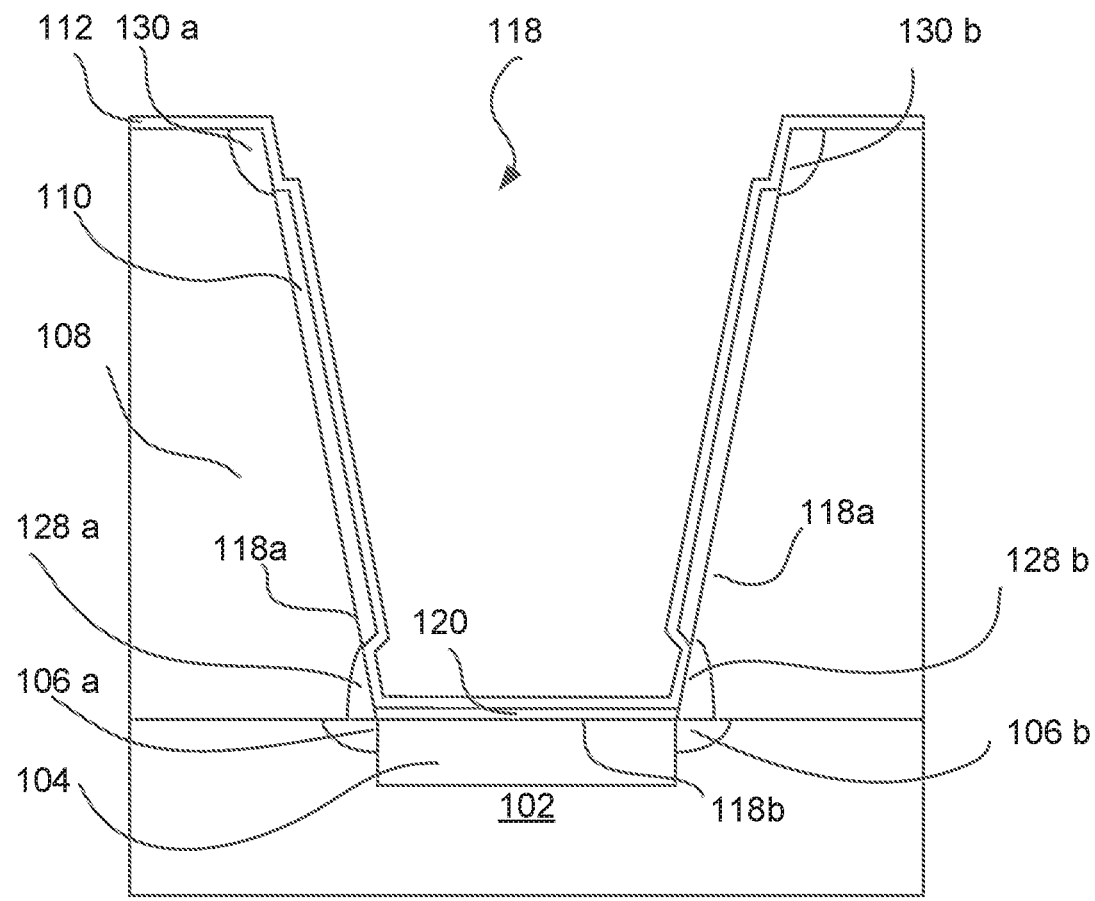

In FIG. 11, an adhesion layer 112 can be formed on the side portions 118a and the bottom portion 118b of the opening 118. As shown, the adhesion layer 112 can also be formed over the dielectric barrier layer 110 and the conductive layer 120. The adhesion layer 112 can be formed to promote the metal plug 114's adhesion to the surrounding layers in the opening 118. The adhesion layer 112 can also function as a barrier layer to prevent the metal plug 114 from reflow/diffusion into the surrounding layers that the metal plug 114 is in contact with.

In order to meet both the adhesion and barrier requirements, conventional techniques require an adhesion layer with a thickness at least equal to or more than 20 Å. Conventional techniques may also require a conductive layer, such as layer 120' illustrated in FIG. 6, to promote the nucleation/incubation of the adhesion layer, such as adhesion layer 112. However, as the critical dimension (CD) of the contact structure shrinks, conventional techniques cannot meet the requirement of providing sufficient spacing for the formation of the metal plug 114 in the contact opening 118 and can cause voided or incomplete metal plug 114 formation. In addition, an adhesion layer 112 having a reduced thickness of less than 20 Å that is formed from conventional techniques may result in non-conformal and discontinuous coverage along the side portions 118a and bottom portion 118b of the opening 118. A non-conformal and discontinuous adhesion layer 112 along the side portions 118a and bottom portion 118b of the opening 118 fails to serve as a good adhesion and barrier layer to metal plug 114.

By introducing a surface treatment illustrated in FIG. 9, an ultrathin adhesion layer 112 can be formed with a thickness less than 20 Å. The surface treatment illustrated in FIG. 9 modifies the surface condition of the contact opening 118, which in turn enhances the nucleation of the adhesion layer 112 and promotes the formation of a conformal and continuous adhesion layer 112 on the side portions 118a and bottom portion 118b of the opening 118. As shown in FIG. 11, the adhesion layer 112 is uniformly and continuously deposited on the side portions 118a and bottom portion 118b of the opening 118, and is in direct contact with the dielectric layer 108, the conductive layer 120, and the dielectric barrier layer 110. The adhesion layer 112 disclosed herein acts as a good barrier layer and an adhesion layer to metal plug 114, and also leaves sufficient spacing for the formation of void-free metal plug 114. In various embodiments, the adhesion layer 112 may include TiN, TaN or the like, and be deposited by a suitable deposition process, such as chemical vapor deposition (CVD), physical vapor deposition (PVD), atomic layer deposition (ALD), sputtering, e-beam evaporation, or any combination thereof.

It should be noted that the ultrathin adhesion layer 112 with a thickness less than 20 Å can be conductive. As shown in FIG. 11, after the formation of the ultrathin adhesion layer 112, two conductive regions are formed in the contact opening 118. The first conductive region can be formed over the bottom portion 118b of the contact opening 118 and can include the conductive layer 120 and the adhesion layer 112 that is deposited on the bottom portion 118b of the opening.

The second conductive region can be basically the adhesion layer 112 that is deposited over the side portion 118a of the contact opening 118 and the dielectric barrier layer 110. Comparing to the second conductive region which has a thickness less than 20 Å, the first conductive region formed over the bottom portion 118b of the contact opening 118 can have a bigger thickness in the range from 30 Å to 70 Å, for example.

Figure 12:
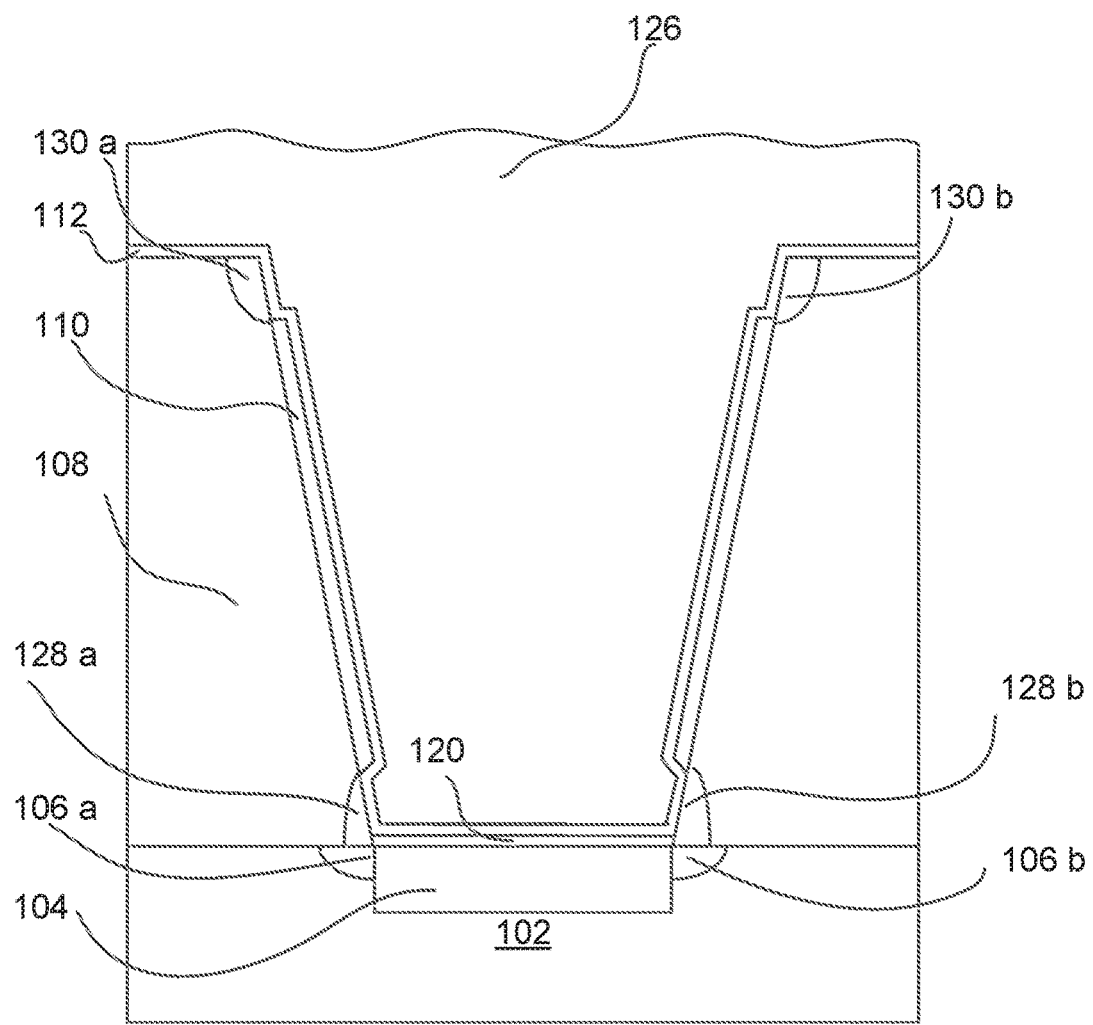

In FIG. 12, a metal layer 126 is deposited to fill in the contact opening 118. The metal layer 126 may include cobalt (Co), tungsten (W), ruthenium (Ru), aluminum (Al), or other suitable conductors, and be deposited by a suitable deposition process, such as electro-chemical plating (ECP) process, chemical vapor deposition (CVD), physical vapor deposition (PVD), atomic layer deposition (ALD), sputtering, e-beam evaporation, or any combination thereof. Alternatively, the metal layer 126 may include copper (Cu), copper magnesium (CuMn), copper aluminum (CuAl), and the like, and an electro-chemical plating (ECP) process may be applied. In some embodiments, a conductive seed layer (not shown) is formed before the metal layer 126. The conductive seed layer can contain a pure metal, such as cobalt (Co), copper (Cu). In some embodiments, the conductive seed layer at least contains the main metal element, such as Co or Cu, as contained in the metal layer 126, or the conductive seed layer is copper-containing layer, such as CuAl, CuMn, or the like. The conductive seed layer can be formed by using physical vapor deposition (PVD) or other well-known deposition techniques. The conductive seed layer can have a thickness of, for example, about 100 Å to about 450 Å.

Figure 13:
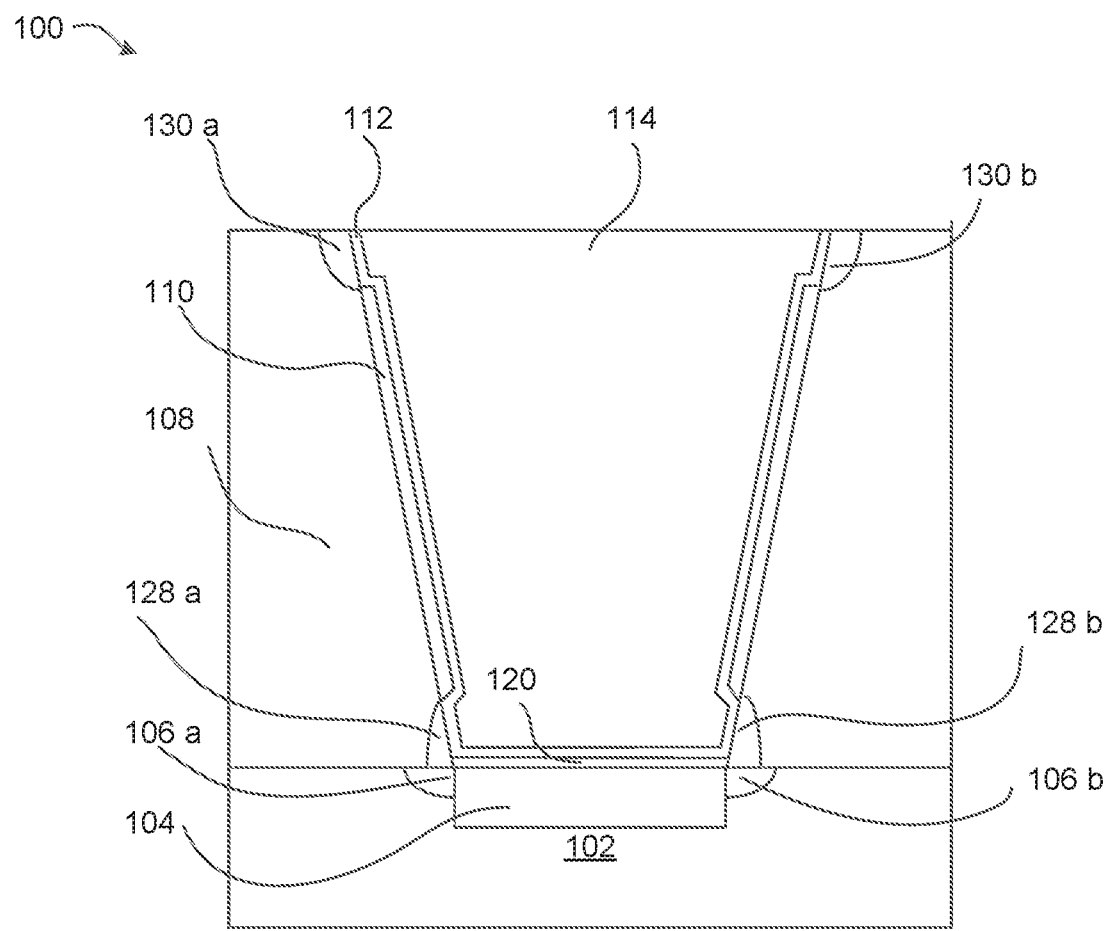

In FIG. 13, the metal layer 126 may be recessed, as well as the adhesion layer 112 over the dielectric layer 108, to provide a planar topography. A chemical mechanical polishing (CMP) process can be performed to remove any excessive metal layer 126 and adhesion layer 112. Alternatively, an etching back process may be applied to remove any excessive metal layer 126 and adhesion layer 112. The remaining metal layer 126 in the contact opening 118 forms a metal plug 114. In FIG. 13, a final contact structure 100 is formed which is identical to the contact structure 100 illustrated in FIGS. 1A and 1B.

Figure 14:
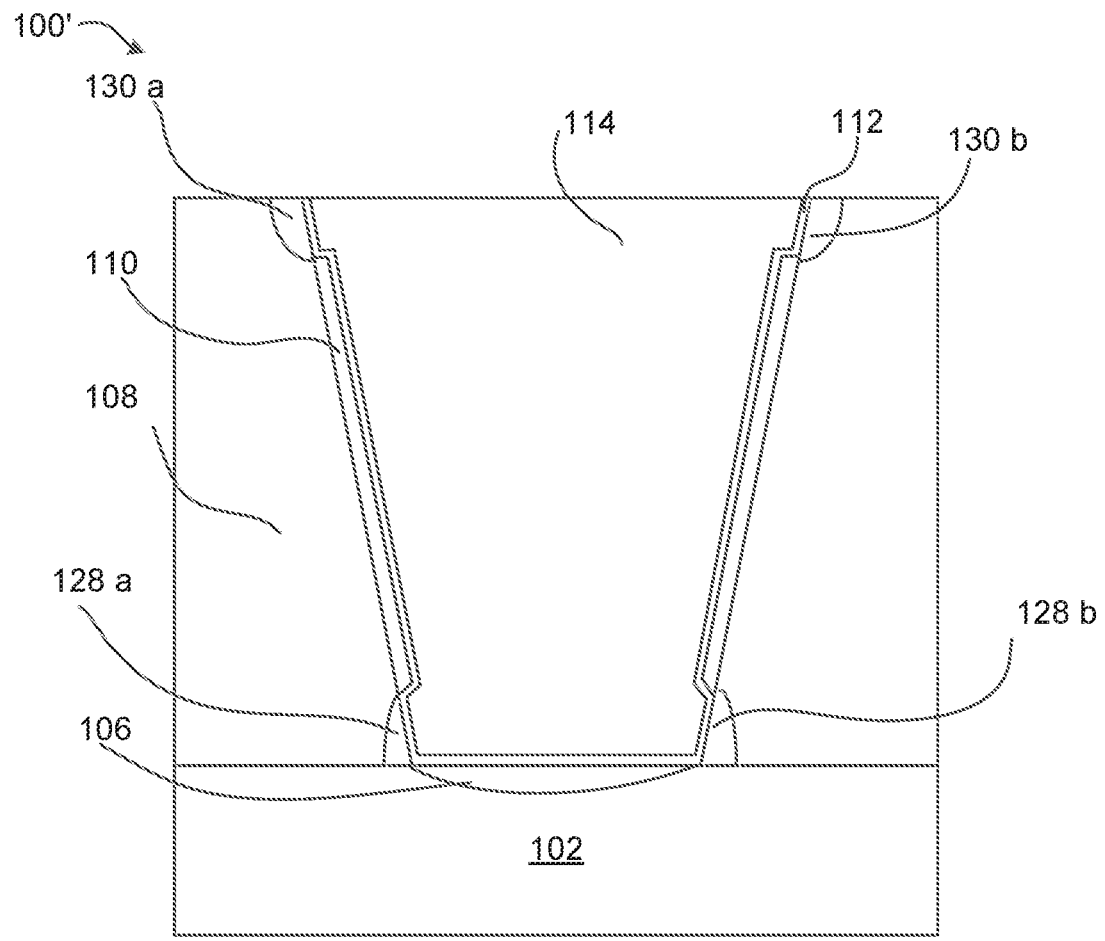
FIG. 14 illustrates an exemplary schematic cross-sectional view of an alternative contact structure, in accordance with some embodiments.

Referring now to FIG. 14, an alternative contact structure 100' is described. Compared to the contact structure 100 illustrated in FIGS. 1A and 1B, the difference is that the alternative contact structure 100' is missing a silicide region 104 or conductive layer 120 in the substrate 102. Similar to contact structure 100, the contact structure 100' also has annularly shaped N-rich areas that are formed in the dielectric layer 108. A nitridation region 106 can be formed beneath the adhesion layer 112 in the substrate 102. As shown, the nitridation region 106 can extend across the bottom portion of the opening within the substrate 102 with a varying depth depending on the design.

In order to form the contact structure 100', the process will still begin with patterning an opening 118 in a dielectric stack to expose an underlying substrate 102 (FIG. 2 and FIG. 3). The next step is forming a dielectric barrier layer 110 on the side portions 118a of the opening 118 (FIGS. 4 and 5). The process then proceeds to perform the surface treatment (FIG. 9, without conductive layer 120 and silicide region 104), and as a result of the surface treatment, the N-rich areas and the nitridation region can be formed (FIG. 10, without conductive layer 120 and silicide region 104). The process flow can then proceed to form an adhesion layer 112 on the side portions 118a and the bottom portion 118b of the opening (FIG. 11, without conductive layer 120 and silicide region 104). The whole process flow ends in forming a metal plug 114 in the opening over the adhesion layer 112 (FIGS. 12 and 13, without a conductive layer 120 or silicide region 104).

In some embodiments, the contact structure 100' is applied in backend of line (BEOL), where the substrate 102 may be copper (Cu), tungsten (W), aluminum (Al), cobalt (Co), or other well-known materials applied in BEOL. In some embodiments, the contact structure 100' may be applied in middle end of line (MEOL) wherein the contracture structure 100' is connected to high-K/metal gate stack. In this situation, the substrate 102 may include W, TiN, TaN, AlTiC, AlTiO, AlTiN, or the like, or the combination thereof. In some embodiments, the contact structure 100' disclosed herein may be applied in other contact loops. Of course, the advantage of the present disclosure still exists in contact structure 100', where a dielectric barrier 110 serves as an effective layer to prevent electrical short and promote reliability; an ultrathin adhesion layer 112, as well as the N-rich areas (130a, 130b and 128a, 128b) and the nitridation region (106) are present to prevent the metal plug 114 from reflow and promote the adhesion of metal plug 114 to the surrounding layers in the contact opening 118; and the ultrathin adhesion layer 112 provide spacing for the formation of void-free metal plug 114.

Figure 15:
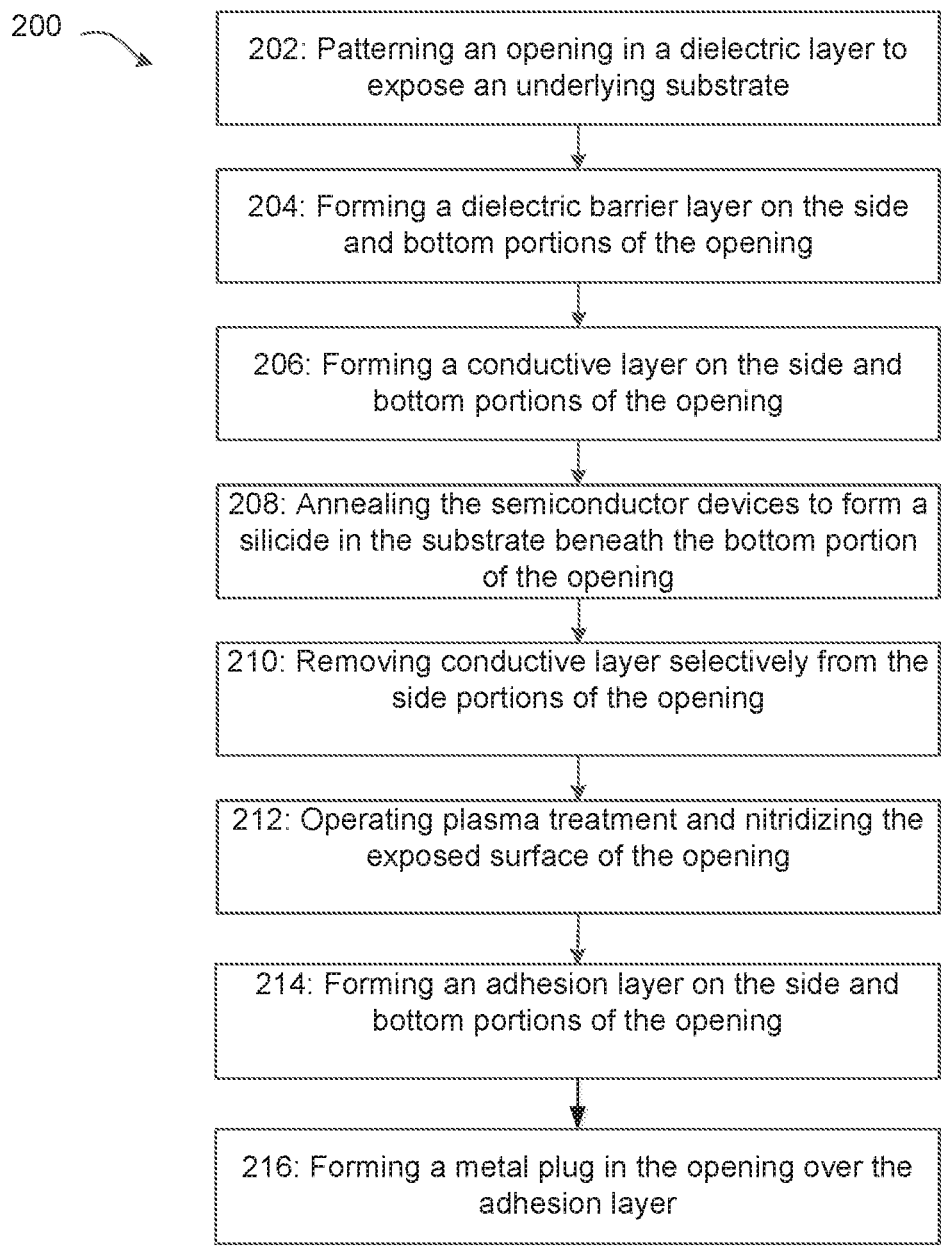
FIG. 15 illustrates an exemplary process flow for manufacturing a contact structure, in accordance with some embodiments.

FIG. 15 illustrates an exemplary process flow 200 for forming a contact structure 100 in accordance with some embodiments. The process begins in step 202, where an opening or contact region can be patterned in a dielectric layer. The dielectric layer 108 can be formed on a substrate 102. The opening 118 may expose the underlying substrate region 102 for electrical connection, such as a source/drain region, a gate electrode, or other components in the semiconductor device. For example, the step 202 can be illustrated in FIGS. 2 and 3.

Next, in step 204, a dielectric barrier layer may be deposited on side and bottom portions of the opening. Subsequently, the dielectric barrier layer may receive an etching process, such as a blanket dry etching. During the blanket dry etching, the bottom portion of the dielectric barrier layer can be removed. Further, a top portion of the dielectric barrier layer along an upper side portion of the opening can be removed as well. As a result of the blanket etching process, only a portion of the dielectric barrier layer remains covering a part of the side portion of the contact opening. An example of the dielectric barrier layer 110 is shown in FIG. 5. Comparing with the conventional techniques, a dielectric barrier layer 110 is introduced in current disclosure. The dielectric barrier layer 110 disclosed herein can effectively prevent the electrical short and the reliability failure as the semiconductor devices move to advanced technology nodes, such as 10 nm or beyond.

The process flow 200 then proceeds to step 206 where a conductive film is deposited in the opening, as well as over the exposed substrate 102. For example, the step 206 can be illustrated in FIG. 6.

Subsequently, the process flow 200 proceeds to step 208 where an annealing process can be used to form a silicide region in the substrate beneath the bottom portion of the contact opening. Step 208 can be illustrated in FIG. 7. In step 208, a silicide may be formed by diffusing the conductive layer into upper portion of substrate. The process flow 200 then proceeds to step 210.

In step 210, the conductive layer 120 can be selectively removed by either a dry etching or a wet etching or other suitable process. After a selective etching process, a part of the conductive layer along the side portions of the opening can be removed while a part over the bottom portion of the opening remains. Comparing with conventional techniques, the conductive layer is selectively removed in current disclosure to provide spacing for the formation of the void-free metal plug. Step 210 can be illustrated in FIG. 8.

The process flow 200 then proceeds to step 212 where a surface treatment is applied to treat the opening. As describe with reference to FIG. 9, a surface treatment 124 is applied to the opening 118 to enhance the nucleation/incubation of the subsequently deposited adhesion layer 112. In addition, the surface treatment can form N-rich areas and a nitridation region (FIG. 10). Both the N-rich areas and the nitridation region can function as barrier layers to the metal plug 114 and prevent the metal plug 114 from diffusing into the surrounding layers.

The process flow 200 then proceeds to step 214 where an ultrathin adhesion layer can be formed on the side portions and the bottom portion of the contact opening. As describe with reference to FIG. 11, an ultrathin adhesion layer 112 with a thickness less than 20 Å is deposited in the contact opening 118. The adhesion layer 112 acts as a barrier layer and an adhesion layer to metal plug 114. In order to meet both the adhesion and barrier requirement, conventional techniques require an adhesion layer with a thickness more than 20 Å. However, as the critical dimension (CD) of the contact structure shrinks, conventional techniques cannot meet the requirement of providing sufficient spacing for the formation of the metal plug 114 in the contact opening 118 and can cause voided or incomplete metal plug 114 formation. By introducing a surface treatment illustrated in FIG. 11, an ultrathin adhesion layer 112 can be formed with a thickness less than 20 Å. The adhesion layer 112 disclosed herein acts as a good barrier layer and an effective adhesion layer to metal plug 114, and also leave sufficient spacing for the formation of void-free metal plug 114.

The exemplary process flow 200 then proceeds to the step 216, where a metal layer can be deposited to fill the contact opening and a surface planarization process, such as CMP, can be performed to remove the any excessive metal layer and adhesion layer. After the surface planarization, a metal plug is formed and the contact structure is complete. For example, the step 216 can be illustrated in FIGS. 12 and 13.

It should be noted herein that the alternative device structure 100' illustrated in FIG. 14 can also be manufactured through the process flow 200. In order to produce a contact structure 100', the process flow 200 can start with step 202, and then proceed to 204. After step 204, process flow 200 can skip steps 206, 208, and 210. Process flow 200 then proceeds to step 212, 214 and ends in step 216.

It should be noted that additional steps can be provided before, during, and after the exemplary method 200, and some of the steps described can be replaced, eliminated, or moved around for additional embodiments of the method 200. In subsequent process steps, various additional interconnect structures (e.g., metallization layers having conductive lines and/or vias) may be formed over the dielectric layer 108. Such interconnect structure electrically connect the contact structure 100 with other contact structures and/or active devices to form functional circuits. Additional device features such as passivation layers, input/output structures, and the like may also be formed.

With respect to the description provided herein, the present disclosure offers methods and structures for forming a contact structure which avoids many of the pitfalls of conventional processing techniques, as the semiconductor devices shrinks to advanced technology node, such as 10 nm and beyond. Contact structure formed through conventional techniques may end in voids and defects as semiconductor device moves to advanced technology node. Embodiments of the present disclosure advantageously provide a novel plasma treatment which promotes the formation of a uniform and continuous ultrathin adhesion layer (thickness less than 20 Å) in the contact structure. The ultrathin adhesion layer disclosed herein provides sufficient spacing for the formation of the void-free metal plug, and acts as an effective barrier layer and an adhesion layer to the metal plug in the contact structure. In order to meet both the adhesion and barrier requirements, conventional techniques require an adhesion layer with a thickness at least equal to or more than 20 Å, which cannot meet the requirement of providing sufficient spacing for the formation of void-free metal plug. If the thickness is less than 20 Å, the adhesion layer formed from conventional techniques can be non-conformal and discontinuous that cannot meet the barrier and adhesion requirements.

The surface treatment disclosed herein can also form N-rich areas and a nitridation region. The formed N-rich areas and nitridation region act as barrier layers to the metal plug and prevent the metal plug from diffusing into the surrounding layers. In the current disclosure, a dielectric barrier layer on the side portions of the contact structure is disclosed as well. The dielectric barrier layer acts as a diffusion barrier layer to prevent the electrical short and the reliability failure such as the TDDB (Time-dependent dielectric breakdown). Those of skill in the art will readily appreciate that the methods and structures described herein may be applied to a variety of other semiconductor devices to advantageously achieve similar benefits from such other devices without departing from the scope of the present disclosure.

As described above, aspects of the disclosure can provide a method for forming a semiconductor contact structure that includes forming a dielectric layer over a substrate and patterning a contact region in the dielectric layer, the contact region having side portions and a bottom portion that exposes the substrate. The method can further include forming a dielectric barrier layer in the contact region to cover the side portions and the bottom portion, and etching the dielectric barrier layer to expose the substrate. Subsequently, a conductive layer can be formed in the contact region to cover the side portions and the bottom portion of the contact region and the conductive layer can be annealed to form a silicide region in the substrate beneath the bottom portion of the contact region, and the conductive layer can then be selectively removed on the side portions of the contact region and the remaining conductive layer covers the bottom portion of the contact region over the silicide region. Afterwards, the method can include performing a surface treatment in the contact region to nitridize the side portions of the contact region to form the N-rich areas in the dielectric layer and the bottom portion of the contact region to form a nitridation region in the substrate, and forming an adhesion layer in the opening to cover the side portions and the bottom portion of the contact region, including the silicide region in the substrate and the dielectric barrier layer.

According to another aspect of the disclosure, a semiconductor device is described that includes a dielectric layer formed on a substrate having an contact region extending through the dielectric layer to the substrate, the contact region having side portions and a bottom portion. The device also includes a silicide region located in the substrate beneath the bottom portion of the contact region having a conductive layer that is formed over the silicide region, and a dielectric barrier layer that at least partially covers the side portions of contact region. The device can also include N-rich areas formed in the dielectric layer along the side portions of the contact region and a nitridation region formed adjacent to the bottom portion of the contact region within the substrate. The device further includes a metal plug located within the contact region, and an adhesion layer arranged between the metal plug and the dielectric barrier layer, dielectric layer, and silicide region.

As described in another aspect of the disclosure, a method for forming a semiconductor contact structure can include depositing a dielectric layer over a substrate and etching an contact region in the dielectric layer, the contact region having side portions and a bottom portion that exposes the substrate. The method can further include depositing a dielectric barrier layer in the contact region to cover the side portions and the bottom portion, and etching the dielectric barrier layer to expose the substrate. Subsequently, a surface treatment can be applied in the contact region to nitridize the side portions of the contact region to form the N-rich areas in the dielectric layer and the bottom portion of the contact region to form a nitridation region in the substrate, and an adhesion layer is deposited in the contact region to cover the side portions and the bottom portion of the contact region, including the dielectric barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor contact structure, the method comprising:
    forming a dielectric layer over a substrate;
    patterning a contact region in the dielectric layer, the contact region having side portions and a bottom portion that exposes the substrate;
    forming a dielectric barrier layer in the contact region to cover the side portions and the bottom portion, and etching the dielectric barrier layer to expose the substrate;
    forming a conductive layer in the contact region to cover the side portions and the bottom portion of the contact region;
    annealing the conductive layer to form a silicide region in the substrate beneath the bottom portion of the contact region, then removing the conductive layer on the side portions of the contact region;
    performing a surface treatment on the side portions and the bottom portion of the contact region that forms a nitridation region in the substrate; and
    forming an adhesion layer in the contact region to cover the side portions and the bottom portion of the contact region, including the silicide region in the substrate and the dielectric barrier layer.

2. The method of claim 1, wherein the surface treatment is at least one of an isotropic plasma treatment, a free radical plasma treatment, an implantation, and a wet chemical treatment.

3. The method of claim 1, wherein etching the dielectric barrier layer to expose the substrate removes a portion of the dielectric barrier layer to form exposed side portions of the contact region.

4. The method of claim 3, wherein performing the surface treatment in the contact region nitridizes the dielectric layer in the exposed side portions of the contact region to form N-rich areas therein and nitridizes the bottom portion of the contact region to form the nitridation region in the substrate.

5. The method of claim 1, where the adhesion layer formed in the contact region to cover the side portions and the bottom portion of the contact region has a thickness of less than 20 Å.

6. The method of claim 5, wherein the adhesion layer that is formed in the contact region to cover the side portions and the bottom portion of the contact region is a continuous and conformal layer.

7. The method of claim 1, wherein the adhesion layer is formed of TiN or TaN.

8. The method of claim 1, further comprising forming a metal plug in the contact region that is in contact with the adhesion layer.

9. The method of claim 1, wherein etching the dielectric barrier layer further exposes an upper portion of the dielectric layer and a lower portion of the dielectric layer, and the dielectric barrier layer is between the upper portion of the dielectric layer and the lower portion of the dielectric layer after etching the dielectric barrier layer.

10. A method for forming a semiconductor contact structure, the method comprising:
    depositing a dielectric layer over a substrate;
    etching a contact region in the dielectric layer, the contact region having side portions and a bottom portion that exposes the substrate;
    depositing a dielectric barrier layer in the contact region to cover the side portions and the bottom portion, and etching the dielectric barrier layer to expose the substrate;
    applying a surface treatment in the contact region to nitridize the side and bottom portions of the contact region, wherein a portion of the dielectric layer and the dielectric barrier layer are exposed during the surface treatment; and
    depositing an adhesion layer in the contact region to cover the side portions and the bottom portion of the opening, including the dielectric barrier layer.

11. The method of claim 10, wherein applying the surface treatment in the contact region nitridizes the side portions of the contact region to form N-rich areas in dielectric layer and nitridizes the bottom portion of the contact region to form the a nitridation region in the substrate.

12. The method of claim 10, wherein the surface treatment applied to treat the contact region includes at least one of a free radical plasma treatment, an isotropic plasma treatment, an implantation, and a wet chemical treatment.

13. A method for forming a semiconductor device, the method comprising:
    etching a contact region in a dielectric layer, the dielectric layer being positioned over a substrate, the contact region having side portions and a bottom portion that exposes the substrate;
    depositing a dielectric barrier layer in the contact region to partially cover the side portions of the contact region;
    forming a silicide region located in the substrate beneath the bottom portion of the contact region having a conductive layer that is formed over the silicide region;

performing a surface treatment on the side portions and the bottom portion of the contact region that forms a nitridation region adjacent the bottom portion of the contact region within the substrate and N-rich areas along the side portions of the contact region; and depositing an adhesion layer in the contact region to cover the side portions and the bottom portion of the contact region, including the silicide region in the substrate and the dielectric barrier layer.

14. The method of claim 13, wherein forming the silicide region located in the substrate beneath the bottom portion of the contact region further comprises:

depositing a conductive layer in the contact region to cover the side portions and the bottom portion of the contact region;

annealing the conductive layer to form a silicide region in the substrate beneath the bottom portion of the contact region; and removing the conductive layer on the side portions of the contact region.

15. The method of claim 13, wherein depositing the dielectric barrier layer in the contact region to partially cover the side portions of the contact region further comprises:

forming the dielectric barrier layer in the contact region to cover the side portions and the bottom portion; and etching the dielectric barrier layer to expose the substrate, and further remove a portion of the dielectric barrier layer to form exposed side portions of the contact region.

16. The method of claim 13, where the adhesion layer formed in the contact region to cover the side portions and the bottom portion of the contact region has a thickness of less than 20 Å.

17. The method of claim 16, wherein the adhesion layer that is formed in the contact region to cover the side portions and the bottom portion of the contact region is a continuous and conformal layer.

18. The method of claim 13, wherein the adhesion layer is formed of TiN or TaN.

19. The method of claim 13, further comprising forming a metal plug in the contact region that is in direct contact with the adhesion layer.

20. The method of claim 13, wherein the N-rich areas are formed in the dielectric layer, and the adhesion layer is in direct contact with the N-rich areas.

* * * * *